United States Patent
Braier et al.

(10) Patent No.: US 7,233,209 B2
(45) Date of Patent: Jun. 19, 2007

(54) INTEGRATED PREAMPLIFIER CIRCUIT FOR DETECTING A SIGNAL CURRENT FROM A PHOTODIODE

(75) Inventors: Martin Braier, Hannover (DE); Karlheinz Muth, Hannover (DE); Gerd Schuppener, Lehrte (DE)

(73) Assignee: Texas Instruments Incorporated, Dallas, TX (US)

( * ) Notice: Subject to any disclaimer, the term of this patent is extended or adjusted under 35 U.S.C. 154(b) by 141 days.

(21) Appl. No.: 10/975,686

(22) Filed: Oct. 27, 2004

(65) Prior Publication Data

US 2005/0116778 A1   Jun. 2, 2005

(30) Foreign Application Priority Data

Nov. 5, 2003   (DE) ............................... 103 51 593

(51) Int. Cl.
*H03F 3/45* (2006.01)
*H03F 3/08* (2006.01)
(52) U.S. Cl. ..................... 330/301; 330/259; 330/308
(58) Field of Classification Search .............. 330/259, 330/301, 308; 250/214 A
See application file for complete search history.

(56) References Cited

U.S. PATENT DOCUMENTS

| 6,759,900 B1* | 7/2004 | Chen ........................... 330/86 |
| 6,778,021 B2* | 8/2004 | Denoyer et al. ............ 330/308 |

* cited by examiner

*Primary Examiner*—Steven J. Mottola
(74) *Attorney, Agent, or Firm*—Warren L. Franz; W. James Brady; Frederick J. Teleck, Jr.

(57) ABSTRACT

An integrated preamplifier circuit for detecting a signal current from a photodiode and converting the signal current into an output voltage is provided. The circuit includes a signal amplifier and a dummy amplifier, the dummy amplifier being matched to the signal amplifier. Each of these amplifiers includes an input transistor and an output transistor, the input transistor of the signal amplifier receiving an input signal derived from the signal current and the input transistor of the dummy amplifier receiving no input signal. The signal and dummy amplifiers provide the desired differential output signal. The input transistors of the signal and dummy amplifiers each have a biasing current source forced to follow a reference current source implemented within the integrated circuit.

9 Claims, 4 Drawing Sheets

INTEGRATED PREAMPLIFIER CIRCUIT FOR DETECTING A SIGNAL CURRENT FROM A PHOTODIODE

CROSS REFERENCE TO RELATED APPLICATIONS

This application claims priority under 35 USC § 119 of German Application Serial No. 103 51 593.3, filed Nov. 5, 2003.

FIELD OF THE INVENTION

The present invention relates to an integrated preamplifier circuit for detecting a signal current from a photodiode and converting the signal current into a voltage.

SUMMARY OF THE INVENTION

In a fiber-optic communication system the preamplifier is used to detect the signal current from the photodiode and converts it into a voltage for subsequent processing. The sensitivity of the receiver and the dynamic range will be determined by this stage. The preamplifier is most commonly implemented as a transimpedance type amplifier, as simplified shown in FIG. 1 of the appending drawings.

As seen in FIG. 1, an amplifier stage Amp has an input connected to a photodiode D and an output connected to the transimpedance feedback resistor Rf and providing an output signal Vo. The photodiode D has its cathode connected to a bias current source Bias and its anode connected to the input of amplifier stage Amp to feed a signal current Is. The capacitance of the photodiode D is represented by a capacitor $C_d$ connected between ground and the anode of photodiode D. This configuration offers a good compromise between bandwidth, sensitivity, and dynamic range.

For the simplified amplifier, the transimpedance gain and the 3 dB bandwidth are given by Eqs. 1 and 2, where A is the open-loop voltage gain of the amplifier, Cd is the photodiode capacitance, and $R_f$ is the transimpedance feedback resistance [See, A. Buchwald and K. Martin, "Integrated Fiber-Optic Receivers," Kluwer Academic Publishers, 1995].

$$\frac{V_o(\omega)}{I_s(\omega)} = \frac{-R_f}{1 + \frac{j\omega R_f C_d}{A}} \quad (1)$$

$$f_{3dB} = \frac{A}{2\pi R_f C_d} \quad (2)$$

A more detailed block diagram of a transimpedance type preamplifier implementation is shown in FIG. 2. The transimpedance amplifier (TIA) detects the signal current from the photodiode and converts it into a single-ended voltage which is converted into a differential voltage by a paraphase amplifier. For single-ended to differential conversion the voltage amp requires a reference potential which corresponds to the TIA output voltage with no input signal. The Dummy-TIA which is matched to the signal TIA generates this reference level accurately over process, temperature, and supply. The output of the voltage amplifier finally is buffered by a 50 Ω load driver.

The present invention is directed to an improvement of the TIA and Dummy-TIA stages.

FIG. 3 shows a common emitter stage with an npn transistor Q that has its base connected to the anode of photodiode D and its collector connected to an input of an amplifier stage A2. The output of amplifier stage A2 is connected to the base of transistor Q through feedback resistor $R_f$ and provides an output signal $V_o$. The collector of transistor Q is connected to supply terminal $V_{cc}$ through a collector resistor $R_c$.

The common-emitter configuration exhibits the highest gain of the three possible transistor configurations and therefore, a common-emitter configuration, as shown in FIG. 3 is widely used as the input stage for the TIA, while output buffering is often performed using an emitter follower, thus $A2 \approx 1$ and $A=g_m R_C$, where $g_m = qI_C/kT$ is the transconductance of the common emitter transistor.

Thus, it can be stated according to Equation 2 that the bandwidth, through $g_m$, is dependent on both operating point $I_C$ of transistor Q and temperature T. A more detailed analysis would reveal additional bandwidth impact through, e.g., bias dependent capacitances and temperature drift of resistances.

Performing a noise analysis will yield an equivalent current noise spectral density of [see, A. Buchwald and K. Martin, "Integrated Fiber-Optic Receivers," Kluwer Academic Publishers, 1995; T. V. Muoi, "Receiver Design for High-Speed Optical-Fiber Systems," IEEE Journal of Lightwave Technology, vol. LT-2, no. 3, pp. 243–267, 1984; and R. G. Meyer, and R. A. Blauschild, "A Wide-Band Low-Noise Monolithic Transimpedance Amplifier", IEEE Journal of Solid-State Circuits, vol. 21, no. 4, pp. 530–537, 1986]

$$\frac{\overline{i_i^2}}{\Delta f} = \frac{4kT}{R_f} + \frac{2qI_c}{\beta} + 4kTr_b\omega^2 C_d^2 + \left(2qI_c + \frac{4kT}{R_c}\right)\left[\frac{\omega(C_\pi + C_u + C_d)}{g_m}\right]^2 \quad (3)$$

In Equation 3, the first term on the right-hand side is the thermal noise contribution of the feedback resistor, the second term is attributed to base current shot noise given by the collector bias current divided by the DC current gain, the third term is thermal noise contribution of the base resistor, and the product term is attributed to collector shot noise and load resistor thermal noise.

Again, strong dependence of noise performance on operating point and temperature can be observed.

As shown in FIG. 4, a standard TIA configuration consists of a common-emitter input stage with an npn input transistor $Q_1$ and a common-collector output with a pnp output transistor $Q_2$. The feedback resistor $R_f$ sets the transimpedance gain. The circuit is self-biasing. With no input current, the voltage at node B, the emitter of $Q_2$, equals $V_{BE}$ and at node A, the collector of $Q_1$, the voltage is $2V_{BE}$, assuming $V_{BE}(Q_1)=V_{BE}(Q_2)$ and negligible base currents (thus the voltage drop across $R_f$ equals zero). With a resistor $R_1$ between supply terminal $V_{cc}$ and the collector of transistor $Q_1$, the biasing collector current of $Q_1$ is given by $$I_{C1} = \frac{V_{CC} - 2V_{BE}}{R_1} \quad (4)$$

while the collector current of $Q_2$ is set by the current source, $I_1$. The input signal current is flowing through $R_f$.

According to Equation 4, the self biasing results in dependency on process ($V_{BE}$, $R_1$), temperature ($V_{BE}$), and supply voltage ($V_{CC}$).

Hence, as pointed out in the above discussion, strong variation of critical performance parameters with process, temperature and supply can be observed. A voltage regulator for the positive supply rail would alleviate the problem of supply variation somewhat, however, would not allow for temperature drift compensation. The variation makes design centering over operating corners difficult and may lead to contradicting design requirements to satisfy the performance needs.

The present invention provides an integrated preamplifier circuit with transimpedance amplifier signal and dummy stages that have a reduced supply voltage variation, a tailored temperature variation and a process variation related to a variation of an on-chip resistor.

According to the invention, an integrated preamplifier circuit for detecting a signal current from a photodiode and converting the signal current into an output voltage is provided. The circuit comprises a signal amplifier and a dummy amplifier, the dummy amplifier being matched to the signal amplifier. Each of these amplifiers includes an input transistor and an output transistor, the input transistor of the signal amplifier receiving an input signal derived from the signal current and the input transistor of the dummy amplifier receiving no input signal. The signal and dummy amplifiers provide the desired differential output signal. The input transistors of the signal and dummy amplifiers each have a biasing current source forced to follow a reference current source implemented within the integrated circuit.

Accordingly, it is proposed to control the biasing current to the input transistors of the transimpedance signal and dummy stages in a manner that it is forced to follow a reference current. The reference current and its temperature behavior can be tailored to trade bandwidth, noise and current consumption in order to satisfy the specification needs. For instance, keeping the current constant with temperature would be beneficial for overall current consumption and noise, but leads to decreasing bandwidth with increasing temperature, while a PTAT current with positive temperature coefficient (TC) can be tailored to yield constant bandwidth at the expense of increased current consumption and noise.

In the preferred embodiment, the reference current source comprises a band-gap reference voltage source and an on-chip resistor.

BRIEF DESCRIPTION OF THE DRAWINGS

Further advantages and features will appear from the following description of a preferred embodiment with reference to the appending drawings. In the drawings

DETAILED DESCRIPTION OF THE DRAWINGS

Figure 4:
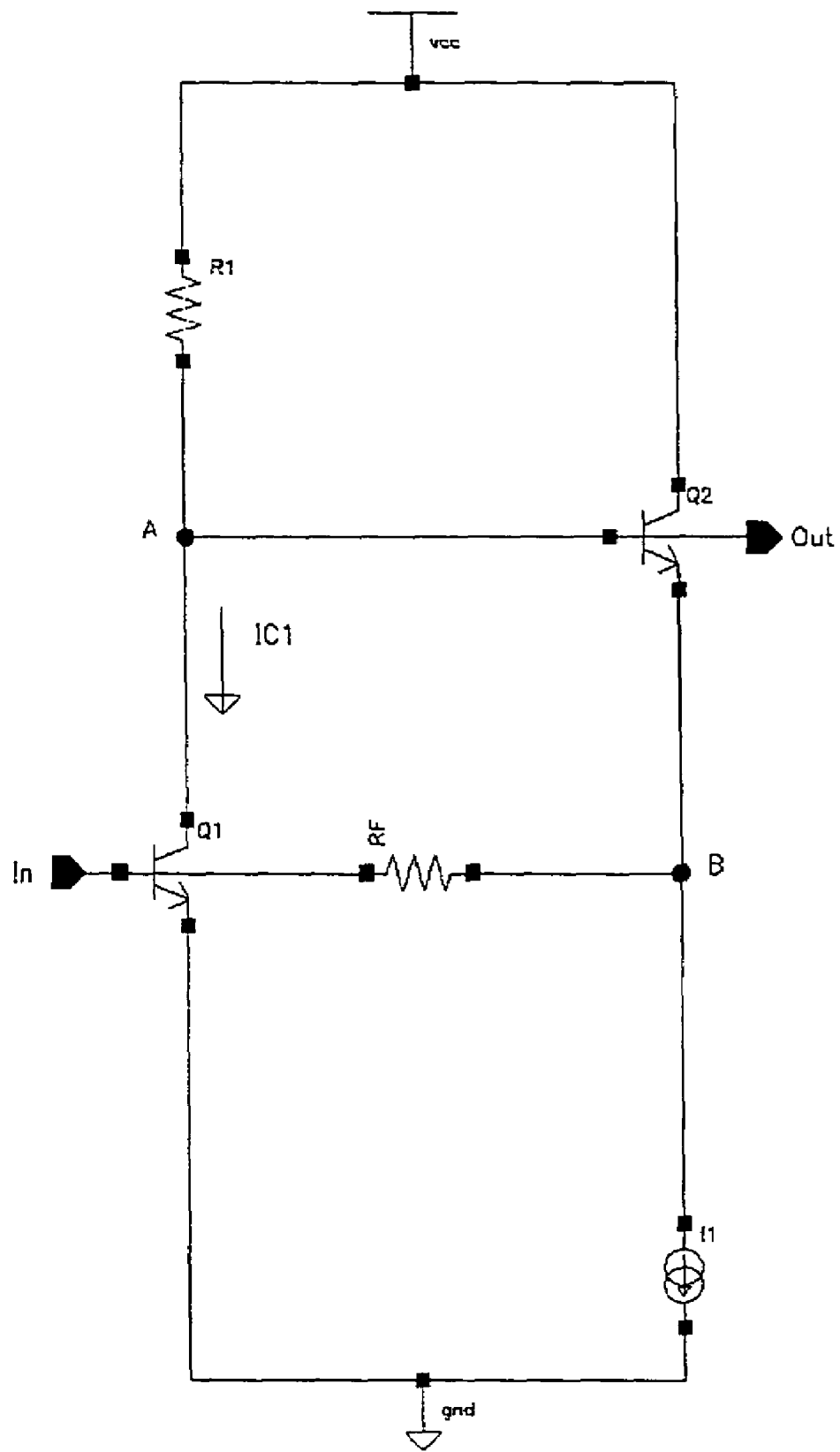
Figure 5:
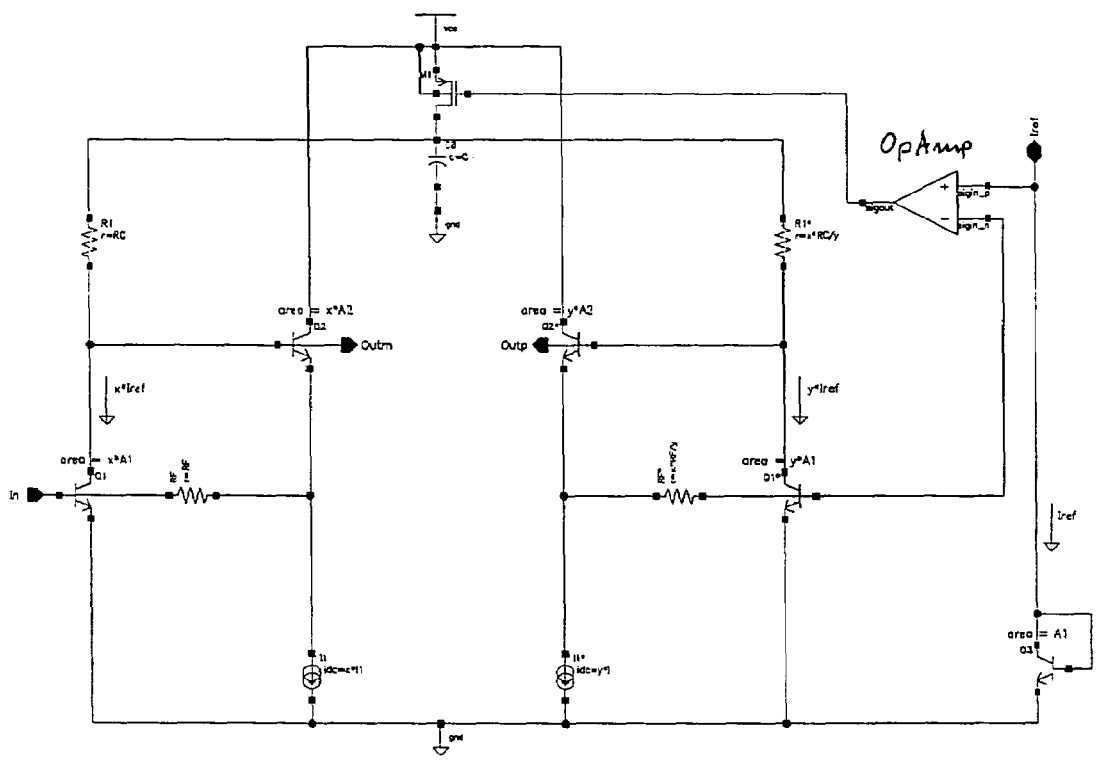
FIG. 5 is a circuit diagram of an exemplary embodiment of the invention.

With reference to FIG. 5, a first transimpedance amplifier, a signal amplifier, includes a transistor pair with an input npn-transistor $Q_1$ in common-emitter connection and an output npn-transistor $Q_2$ in common-collector connection. A feedback resistor RF connects the emitter of transistor $Q_2$ with the base of transistor $Q_1$ to which an input signal is applied. An output Outm is taken from the collector of transistor $Q_1$, which is connected to the base of transistor $Q_2$. This configuration is generally similar to that in FIG. 4, with a current source in the emitter path of transistor $Q_2$ and the collector of transistor $Q_2$ connected to a supply terminal $V_{cc}$, but the collector resistor $R_1$ of transistor $Q_1$ is nor connected to the supply terminal $V_{cc}$. Rather, the resistor $R_1$ is connected to a bias current source as will be explained further.

A second transimpedance amplifier in FIG. 5 is a dummy amplifier matched to the signal amplifier and including common-emitter transistor $Q_1^*$, common-collector transistor $Q_2^*$, feedback resistor RF*, current source $I_1^*$ and collector resistor $R_1^*$, the latter being also connected to the bias current source. No input signal is applied to the base of transistor $Q_1^*$, and an output Outp is taken fron the collector of transistor $Q_1^*$.

The bias current source in FIG. 5 includes a field effect transistor M1, a MOSFET, the current path of which is connected in series between supply terminal $V_{cc}$ and resistors $R_1$, $R_1^*$. The gate of transistor $M_1$ is connected to the output of a operational amplifier circuit OpAmp which has an inverting input connected to the base of transistor $Q_1^*$ and a non-inverting input connected to a node between a reference current source Iref and a diode-connected npn-transistor $Q_3$ that has its emitter connected to ground gnd.

In operation, the base-emitter voltage of transistor $Q_1^*$ is sensed and compared to the base-emitter voltage of transistor $Q_3$ which carries the reference current. The operational amplifier circuit OpAmp controls the gate of field effect transistor $M_1$ in a way that bias current $I_{C1}^*$ follows $I_{ref}$. Since the signal and dummy amplifiers are matched, $I_{C1}$ equals $I_{C1}^*$. The MOS device is decoupled from the HF-path by $R_1$ and $C_0$ which allows usage of a large device width. Therefore, drain-source biasing can be low (the device can even operate in linear region) which is beneficial for low-voltage operation. $C_0$ also provides proper ac ground and makes the voltage gain of the common-emitter stage independent from the on-resistance of the MOSFET.

In order to save current in the dummy-amplifier the branch currents and device dimensions are preferably scaled in a manner that the corresponding devices in the two amplifiers operate at identical current densities, as indicated in FIG. 5 for a scaling ratio x/y where x refers to the signal amplifier and y to the dummy amplifier.

Figure 1:
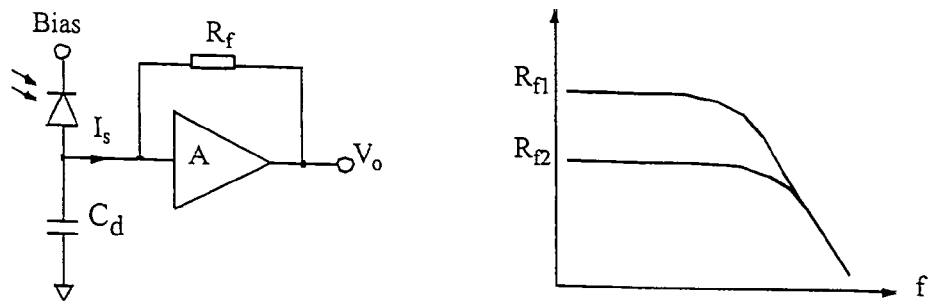
FIGS. 1 to 4 are circuit diagrams relating to the background art as discussed.
Figure 2:
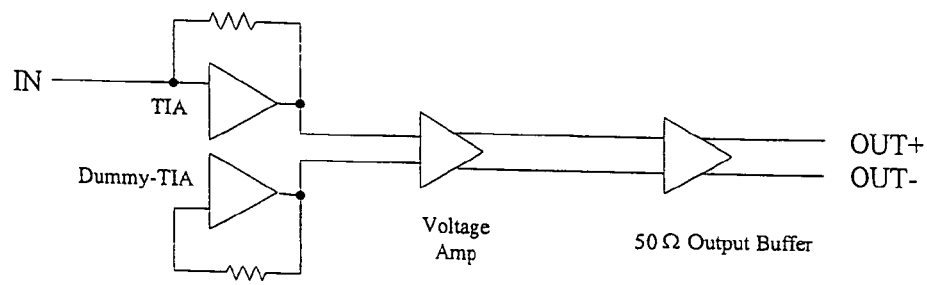

The addition of the dummy amplifier is not only required by the control circuitry but also facilitates single-ended to differential conversion by generating the reference voltage of the paraphrase amplifier, as shown in FIG. 2 [see, W. A. Gross, "Method and apparatus for providing limiting transimpedance amplification", U.S. Pat. No. 5,708,392, Feb. 16, 1996]. Therefore, the proposed circuitry neither requires much of additional components (the Op-Amp and the MOS device would be even required for a voltage regulator) nor does it result in a considerably increased current consumption.

In conclusion, the proposed method addresses the inherent variation of critical performance parameters over process, temperature and supply and allows compensation by means of adjusting the circuit's biasing current to a reference current. By this process and supply variation can be minimized and the temperature behavior can be adapted to the performance needs by tailoring the reference current's temperature drift. This yields in a superior overall performance of the proposed architecture as compared to prior art.

Figure 3:
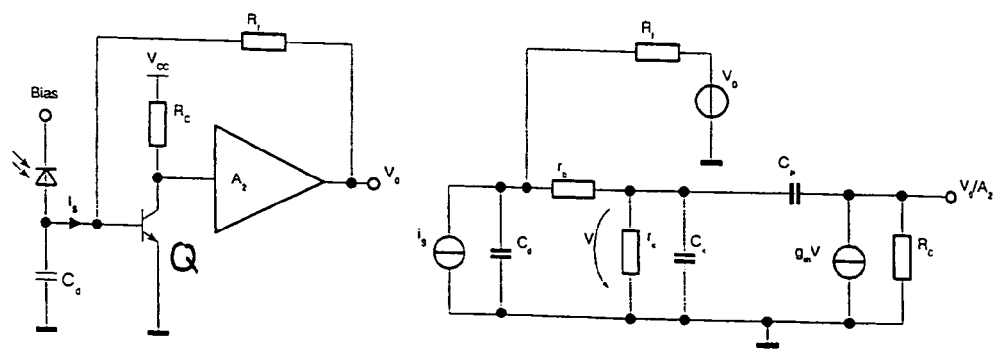

For simplicity, the deduction of the process, temperature and supply dependencies (Equations 3, 4) and the circuit implementation itself (FIGS. 3, 4, 5) is based on the usage of bipolar junction transistors as amplifying semiconductor devices only. However, the proposed method of bias circuit control is applicable as well to usage of other semiconductor amplifying devices, like field effect transistors (FETs).

Figure 6:
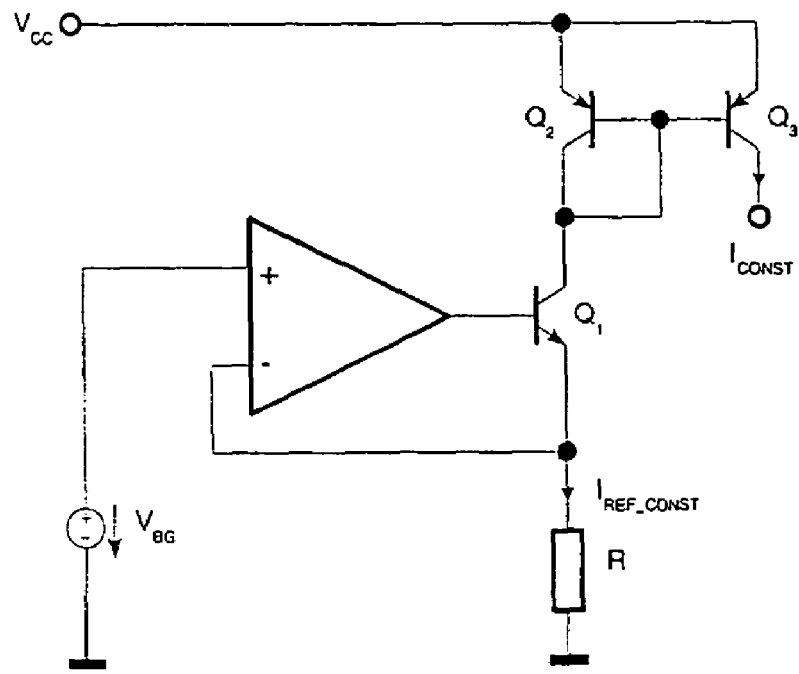
FIG. 6 is a circuit diagram showing a first embodiment of a reference current source.

Using a band-gap reference voltage together with on-chip resistors allows the generation of a reference current, whose process variation is basically identical to the resistor variation. In FIG. 6, a band-gap voltage source is connected to the non-inverting input of an operational amplifier. The output of the operational amplifier is connected to the base of transistor $Q_1$ which carries the collector current IREF_CONST, that generates a voltage drop over resistor R which is fed back to the inverting input of the operational amplifier. This part of the circuit works as a control loop so that the voltage drop over resistor R equals the band-gap voltage. By choosing the value of resistor R the current IREF_CONST can be adjusted. By using a current mirror consisting of $Q_2$ and $Q_3$ the current ICONST which is corresponding to IREF_CONST can be adjusted by the scaling ratio of $Q_2$ and $Q_3$ and can be fed then as a reference current to the diode-connected npn-transistor $Q_3$ in FIG. 5. The process variation of that current is basically identical to the resistor variation.

Figure 7:
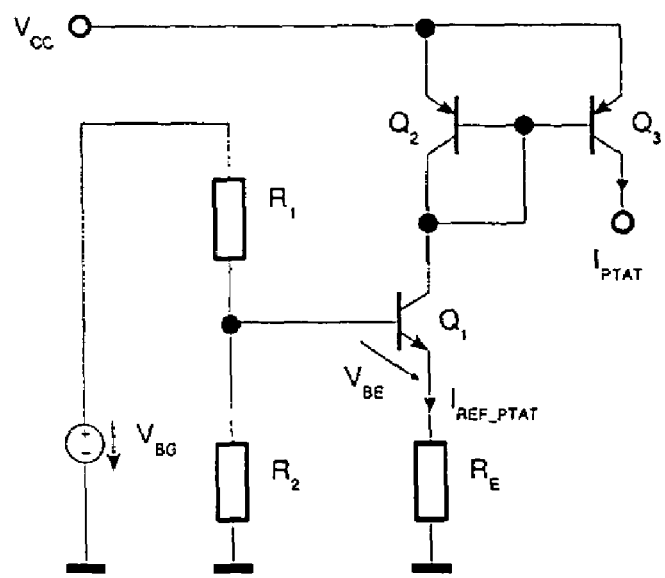
FIG. 7 is a circuit diagram showing a second embodiment of a reference current source.

In some applications a temperature dependent reference current is required. FIG. 7 shows a circuit which generates a reference current according to Equation 5 (base current of $Q_1$ is neglected).

$$I_{REF\_PTAT} = \frac{V_{BG}}{R_E} \cdot \frac{R_2}{R_1 + R_2} - \frac{V_{BE}(\vartheta)}{R_E} \quad (5)$$

The temperature dependence of $V_{BE}(\vartheta)$ leads to a temperature dependent current IREF_PTAT. By choosing the values of $R_1$, $R_2$, and $R_E$, the value and the slope of the temperature dependence of IREF_PTAT can be adjusted. The current IREF_PTAT is then fed again to a current mirror consisting of transistors $Q_2$ and $Q_3$ which generate the corresponding reference current to feed the diode-connected npn-transistor $Q_3$ in FIG. 5 for the TIA circuit IPTAT.

Also, a combination of these constant and PTAT currents can be used as reference current for the transimpedance circuit. Such a combination can be additive or subtractive, according to the characteristic to be tailored.

The invention clamed is:

1. An integrated preamplifier circuit for detecting a signal current from a photodiode and converting the signal current into an output voltage, the circuit comprising:
   a signal transimpedance amplifier and a dummy transimpedance amplifier, the dummy amplifier being matched to the signal amplifier, each of said amplifiers including an input transistor and an output transistor, the input transistor of the signal amplifier receiving an input signal derived from the signal current and the input transistor of the dummy amplifier receiving no input signal, and the signal and dummy amplifiers providing a differential output signal, wherein the input transistors of the signal and dummy amplifiers each have a biasing current source forced to follow a reference current source implemented within the integrated circuit.

2. The integrated preamplifier circuit according to claim 1, wherein the reference current source comprises a band-gap reference voltage source and an on-chip resistor.

3. The integrated preamplifier circuit according to claim 1 or claim 2, wherein the biasing current source comprises a transistor having a current path connected between a supply terminal and a biasing current input for both input transistors, and a control electrode connected to an output of an operational amplifier, the operational amplifier having a first input receiving an input signal derived from the input of the dummy amplifier and a second input receiving an input signal derived from the reference current source.

4. The integrated preamplifier circuit according to claim 3, wherein the reference current from the reference current source is fed through a diode-connected transistor to ground and the voltage drop across the diode-connected transistor is applied to the second input of the operational amplifier.

5. The integrated amplifier circuit according to claim 2, wherein the reference current source comprises a resistor through which a reference control current is fed and a control loop controlling the voltage drop across the resistor so as to equal the voltage of the band-gap voltage source.

6. The integrated amplifier circuit of claim 5, wherein a diode-connected transistor is connected in series in the current path of the resistor and the reference current is taken from a current mirror associated with the diode-connected transistor.

7. The integrated amplifier circuit according to claim 2, wherein the reference current source comprises a transistor with a control electrode to which a voltage derived from the band-gap voltage source is applied, and with a current path including a resistor through which a reference control current is fed, the reference control current being in turn controlled by the voltage applied to the control electrode of the transistor.

8. The integrated amplifier circuit of claim 7, wherein a diode-connected transistor is connected in the current path of the transistor and the reference current is taken from a current mirror associated with the diode-connected transistor.

9. The integrated amplifier circuit according to claim 2, wherein the reference current source comprises
   a first reference current source with a first resistor through which a first reference control current is fed and a control loop controlling the voltage drop across the first resistor so as to equal the voltage of a first band-gap voltage source, and
   a second reference current source with a transistor that has a control electrode to which a voltage derived from a second band-gap voltage source is applied, and a current path including a second resistor through which a second reference control current is fed, the second reference control current being in turn controlled by the voltage applied to the control electrode of the transistor;
   the reference current being combined from the first and second reference current sources.

* * * * *